(12) United States Patent
Zimer et al.

(10) Patent No.: US 9,596,034 B2
(45) Date of Patent: *Mar. 14, 2017

(54) HIGH BRIGHTNESS DENSE WAVELENGTH MULTIPLEXING LASER

(71) Applicant: TRUMPF Laser GmbH, Schramberg (DE)

(72) Inventors: Hagen Zimer, Dunningen-Seedorf (DE); Alexander Killi, Trossingen (DE); Christoph Tillkorn, Villingendorf (DE); Steffen Ried, Herrenberg (DE)

(73) Assignee: TRUMPF LASER GMBH, Schramberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/172,166

(22) Filed: Jun. 3, 2016

(65) Prior Publication Data

US 2016/0285560 A1      Sep. 29, 2016

Related U.S. Application Data

(63) Continuation of application No. 14/053,187, filed on Oct. 14, 2013, now Pat. No. 9,391,713.

(51) Int. Cl.
*H04B 10/572* (2013.01)
*H04J 14/02* (2006.01)
(Continued)

(52) U.S. Cl.
CPC ........... *H04B 10/572* (2013.01); *H01S 5/142* (2013.01); *H01S 5/143* (2013.01); *H01S 5/4087* (2013.01);
(Continued)

(58) Field of Classification Search
CPC .................................................. H04B 10/572
See application file for complete search history.

(56) References Cited

U.S. PATENT DOCUMENTS 9,391,713 B2 *   7/2016  Zimer ................. H04B 10/572
2001/0036206 A1 * 11/2001  Jerman .............. G02B 26/0841
                                                           372/20
(Continued)

*Primary Examiner* — Nathan Curs
(74) *Attorney, Agent, or Firm* — Leydig, Voit & Mayer, Ltd.

(57) ABSTRACT

The present disclosure describes systems and methods for beam wavelength stabilization and output beam combining in dense wavelength multiplexing (DWM) systems. Systems and methods are described for performing beam wavelength stabilization and output beam combining in DWM systems while achieving increased wall-plug efficiency and enhanced beam quality. Interferometric external resonator configurations can be used to greatly increase the brightness of DWM system output beams by stabilizing the wavelengths of the beams emitted by the emitters of the DWM laser source. The resonant cavities described by the present disclosure provide advantages over the prior art in the form of decreased cost, increased wall plug efficiency and increased output beam quality. Particular implementations of the disclosure achieve increased wall plug efficiency and increased output beam quality through a combination of innovative cavity designs and the utilization of reflection diffraction elements for beam combining.

20 Claims, 6 Drawing Sheets

(51) Int. Cl.
  *H01S 3/06*  (2006.01)
  *H01S 5/14*  (2006.01)
  *H01S 3/08*  (2006.01)
  *H01S 5/024*  (2006.01)
  *H01S 5/40*  (2006.01)
  *G02B 7/18*  (2006.01)
  *H01S 3/04*  (2006.01)

(52) U.S. Cl.
  CPC ............ *H04J 14/02* (2013.01); *G02B 7/1815* (2013.01); *H01S 3/0401* (2013.01); *H01S 3/0805* (2013.01); *H01S 5/02438* (2013.01); *H01S 5/4012* (2013.01); *H01S 5/4062* (2013.01)

(56) References Cited

U.S. PATENT DOCUMENTS

| | | | | |
|---|---|---|---|---|
| 2002/0097755 | A1* | 7/2002 | Mross | H01S 3/0903 372/9 |
| 2002/0146054 | A1* | 10/2002 | Hoose | H01S 5/141 372/92 |
| 2003/0206105 | A1* | 11/2003 | Grebenshchikov | G08B 29/183 340/556 |
| 2011/0310921 | A1* | 12/2011 | Chann | G02B 27/0905 372/70 |
| 2012/0020020 | A1* | 1/2012 | Julien | G02B 6/43 361/689 |

\* cited by examiner

HIGH BRIGHTNESS DENSE WAVELENGTH MULTIPLEXING LASER

CROSS REFERENCE TO RELATED APPLICATIONS

This application is a continuation of U.S. application Ser. No. 14/053,187, filed Oct. 14, 2013 and published as U.S. Patent Application Publication No. 2015/0104180 on Apr. 16, 2015.

FIELD OF THE INVENTION

The present disclosure relates generally to laser systems and more particularly to systems and methods for narrow-bandwidth laser beam stabilization and multiple laser beam combining.

BACKGROUND OF THE INVENTION

Dense wavelength multiplexing is a technique for producing a single, high-brightness, multi-spectral, combined output beam from a plurality of individual, narrow spectral bandwidth input beams. DWM enables multiple relatively low-power single wavelength input beams to be superimposed to produce a single, high-power, high-brightness output beam. DWM techniques enable output beam power to be scaled directly with the sum of the power produced by the plurality of input beams and to further provide output beams with beam quality commensurate with the beam quality of the individual input beams.

In DWM systems, a plurality of narrow spectral bandwidth, or single wavelength, laser beams are emitted from a laser source that comprises a plurality of individual emitters. The multi-spectral output beam is formed by combining, or spatially and directionally overlapping, the plurality of individual beams with a beam overlapping element. Beam combining can be achieved through selecting a single wavelength for each of the beams and directing each of the beams at the beam overlapping element with a particular angle of incidence. The wavelength and angle of incidence of each beam is selected such that all of the beams emerge from the beam overlapping element at an overlap region with a common direction of propagation. A set of allowed wavelength-angle pairs can be defined as all combinations of wavelength and angle of incidence that will yield a beam that emerges from the beam overlapping element at the common direction of propagation.

In order to produce a single multi-spectral combined output beam from the plurality of laser beams emitted by the laser source, a wavelength-angle pair from the set of allowed wavelength-angle pairs must be selected for each emitter in the laser source. Angle of incidence selection can be accomplished by fixing the relative position of the laser source and beam overlapping element and placing a position-to-angle transformation lens at a fixed position in the optical path between the laser source and the beam overlapping element. The position-to-angle transformation lens maps the spatial position of each emitter in the laser source to a particular angle of incidence at the beam overlapping element.

For each individual emitter, wavelength selection can be accomplished by providing feedback to the emitter in the form of electromagnetic radiation with the desired wavelength. Providing such electromagnetic radiation to the emitter will excite a resonant mode of the emitter corresponding to the desired output. Thus, providing feedback to the emitter will stimulate the emission of additional electromagnetic radiation with a wavelength that is equivalent to that of the feedback. The resonant feedback will narrow the spectral bandwidth of the laser beam emitted by the emitter and center the wavelength spectrum of the emitted beam about the wavelength of the resonant feedback. This process of providing feedback to an emitter can be referred to as beam wavelength stabilization, or wavelength locking.

Locking the wavelength of each laser beam maps a single wavelength to each position of an emitter in the laser source and creates a set of fixed wavelength-position pairs for the laser source. The position-to-angle transformation lens maps the wavelength-position pair for each emitter in the laser source to a particular wavelength-angle pair. Selecting appropriate wavelength-position pairs ensures that a spatially and directionally overlapped beam will be produced. However, if the wavelength locking is not robust and alternative resonant modes of the individual emitters are excited, the emitters will produce alternative resonant mode components that will thereafter propagate through the system. The beam components produced by the alternative resonant modes do not represent allowed wavelength-position pairs and will therefore not be spatially and directionally overlapped by the beam overlapping element. Furthermore, if such alternative resonant modes are allowed to propagate through an external resonator that provides feedback to the laser source in order to stabilize the wavelength of the beams emitted by the emitters in the laser source, these alternative resonant modes will stimulate the emission of further parasitic, alternative mode components and thereby degrade output beam quality and induce temporal fluctuations in output beam power.

SUMMARY OF THE INVENTION

The present disclosure describes systems and methods for beam wavelength stabilization and output beam combining in DWM systems. The present disclosure more specifically describes systems and methods for performing beam wavelength stabilization and output beam combining in DWM systems while achieving increased output beam brightness, increased wall plug efficiency, and enhanced beam quality relative to the prior art. Wall plug efficiency is a measure of the efficiency with which the system converts electrical power into optical power and can be defined as the ratio of the radiant flux, i.e. the total optical output power produced by the system, to the input electrical power consumed by the system.

Some prior art systems and methods for beam stabilization and output combining utilize transmissive optical elements, and specifically transmissive diffraction gratings, for beam combining purposes. The use of transmissive diffraction elements for beam combining purposes suffers from a number of limitations. Beam stabilization and output combining systems and methods that utilize transmissive diffraction elements present certain disadvantages. For one while the theoretical diffraction efficiency of transmission diffraction elements is very close to one hundred percent, real transmissive diffraction elements cannot achieve such diffraction efficiency in practice. Real transmissive diffraction elements can consistently achieve diffraction efficiencies not substantially greater than about ninety-five percent. Therefore, it is necessary to design external cavities capable of capturing diffraction orders that would not otherwise be used in order to maximize wall-plug efficiency. By contrast, reflection diffraction elements are capable of achieving substantially higher diffraction efficiencies. In practice, reflection diffraction elements can achieve diffraction efficiencies of up to roughly 99.8%. Resonant cavities utilizing reflection diffraction elements can thereby attain an appreciable increase in wall-plug efficiency relative to external resonators that utilize transmissive diffraction elements.

Second as laser beams propagate through transmissive diffraction elements, the transmissive elements absorb a small amount of electromagnetic radiation. Additionally, antireflective coatings covering the front and rear faces of the transmissive diffraction elements absorb a non-insignificant amount of electromagnetic radiation from incident laser beams. The absorption of the electromagnetic radiation generates heat within the regions of the transmissive elements through which the electromagnetic radiation passes. The heat generated by absorption of radiation will propagate towards the periphery of the transmissive elements and a heat-flow gradient will be created within the transmissive element. Such a heat-flow gradient can degrade beam quality and decrease the wall-plug efficiency of the system. At low output power, degradation to beam quality may be insignificant and wall-plug efficiency losses may be relatively minor. However, as beam output power is increased, the generation of heat within the transmissive elements causes more significant beam distortions and efficiency losses. At very high power, e.g. on the order of several kW, beam distortions induced by heat generation become significant. Reflection diffraction elements exhibit extremely low absorption of electromagnetic radiation from incident laser beams and thereby enable power scalability without loss of beam quality or efficiency.

Third, as the output power produced by the system increases, it may become necessary to cool diffraction elements in the system the effects of heat generation become more significant. The geometries of reflective diffraction elements allow for superior cooling techniques as compared to those allowed by transmissive diffraction elements. Geometrical constraints dictate that any cooling system employed alongside a transmissive diffraction element must be situated at an outer boundary, i.e. at the periphery, of the transmissive element. Specifically, the possibility of placing a cooling system on either face of a transmissive element is precluded because radiation enters a transmissive element at one face and exits the element at an opposite face. Cooling systems located at the periphery of transmissive gratings increase the magnitude of thermal gradients by actively drawing heat away from the center of the element and towards the periphery. Peripheral cooling systems thereby induce thermo optical phase distortions in the wave front of the incident laser beams. These induced phase distortions result in decreased diffraction efficiency, changes in beam properties, local changes in the grating constant, and most importantly, dynamic thermal lensing. These effects further decrease the wall-plug efficiency of the system and further deteriorate output beam quality.

By contrast, reflective diffraction elements allow thermal management techniques capable of achieving substantially one-dimensional (in a direction perpendicular to the plane in which the surface of the diffraction element lies) heat-flow in the diffractive element. One dimensional heat-flow suppresses thermal lensing effects and eliminates local differences in the grating constant that result from thermal gradients within the grating. One dimensional heat-flow can be achieved through selecting a diffractive element with an appropriate thickness-to-diameter ratio and the use of a cooling element located on a face of the diffractive element opposite the face at which incident radiation is reflected. The cooling element (i.e. heat sink) is preferably placed in "form-fitting" contact with the grating and may offer an added benefit by providing additional mechanical stability for the device thereby preventing the grating from bending under thermal load. For example, a relatively thin reflective diffraction grating can be bonded to a heat sink with comparatively high heat conductivity. In such a configuration, the thin reflective diffraction grating will act as the main barrier for heat transport and the position of the heat sink relative to grating will facilitate a uniform distribution of thermal energy within the grating itself.

In addition to enabling advantageous geometric positioning of cooling elements, reflective diffraction elements need not be formed from optically transparent materials. Therefore, reflective diffraction elements allow for improved cooling properties through the use of a variety of materials with high heat conductivity and or low coefficients of thermal expansion, e.g. diamond, sapphire, glass-ceramics (e.g. Zerodur), and Zinc Sulfide. Such materials are typically not optically transparent, or not of optical grade, and therefore cannot be used in transmissive diffraction elements without loss in power or beam quality.

One embodiment of the present invention provides a system for stabilizing the wavelength of beams emitted by a plurality of beam emitters, the system comprising the plurality of beam emitters each beam emitter emitting a beam, a first reflection diffraction element, and a feedback branch comprising a spatial filtering system, wherein the first reflection diffraction element directs a portion of the beams originating at the array into the feedback branch as feedback branch input, and wherein the feedback branch directs a portion of the feedback branch input back into the plurality of beam emitters.

An alternative embodiment of the present invention provides a method for stabilizing the wavelength of beams emitted by a plurality of beam emitters, the method comprising directing the emitted beams towards a first reflection diffraction element, directing a portion of the emitted beams from the first reflection diffraction element into a feedback branch as a feedback branch input, and directing a portion of the feedback branch input through the feedback branch and back into the plurality of beam emitters, wherein directing a portion of the feedback branch input through the feedback branch comprises sequentially directing a portion of the feedback branch input through a spatial filtering system.

An additional embodiment of the present invention provides a dense wavelength multiplexing system comprising an array of beam emitters each emitting a single wavelength beam, a first diffraction element reflecting the plurality of single wavelength beams from the array of beam emitters, and a second diffraction element diffracting the reflection of the plurality of single wavelength beams so as to combine the beams into a single multi-wavelength combined beam.

Another additional embodiment of the present invention provides a dense wavelength multiplexing system comprising a plurality of beam emitters each emitting a single wavelength beam and a first diffraction element diffracting a portion of the beams from the plurality of beam emitters so as to combine the beams into a single multi-wavelength combined output beam.

A further embodiment of the present invention provides a dense wavelength multiplexing and beam wavelength stabilization system comprising a plurality of beam emitters each emitting a beam, at least one optical element, a first reflection diffraction grating, a second reflection diffraction grating, and a feedback branch having a first arm and a second arm, wherein the first reflection diffraction grating directs a reflection of the beams towards the second reflection diffraction grating and directs a diffraction of the beams into the first arm of the feedback branch as a first arm input, wherein the second reflection diffraction grating receives the reflection of the beams and diffracts the reflection as an output, wherein the first arm of the feedback branch includes a first highly reflective mirror positioned to reflect the first arm input back toward the first reflection diffraction grating as a first arm output such that the first reflection diffraction grating diffracts a first portion of the first arm output back to the array of beam emitters as a first feedback portion and reflects a second portion of the first arm output into the second arm as a second arm input, and wherein the second arm includes a second highly reflective mirror positioned to reflect the second arm input back to the first reflection diffraction grating as a second arm output such that the first reflection diffraction grating reflects a first portion of the second arm output into the first arm and reflectively diffracts a second portion of the second output arm output towards the second reflection diffraction grating.

Another further embodiment of the present invention provides a dense wavelength multiplexing and beam wavelength stabilization system comprising a plurality of beam emitters each emitting a beam, at least one optical element, a reflection diffraction grating, and a feedback branch having a first arm and a second arm, wherein the reflection diffraction grating directs a reflection of the beams into the first arm of the feedback branch as a first arm input and directs a diffraction of the beams as a system output, wherein the first arm of the feedback branch includes a first highly reflective mirror positioned to reflect the first arm input back toward the reflection diffraction grating as a first arm output such that the reflection diffraction grating reflects a first portion of the first arm output back to the array of beam emitters as a first feedback portion and diffracts a second portion of the first arm output into the second arm as a second arm input, and wherein the second arm includes a second highly reflective mirror positioned to reflect the second arm input back to the reflection diffraction grating as a second arm output such that the reflection diffraction grating reflects a first portion of the second arm output as an additional system output and diffracts a second portion of the second output arm output into the first arm of the feedback branch as an additional first arm input.

DETAILED DESCRIPTION OF THE INVENTION

Figure 1:
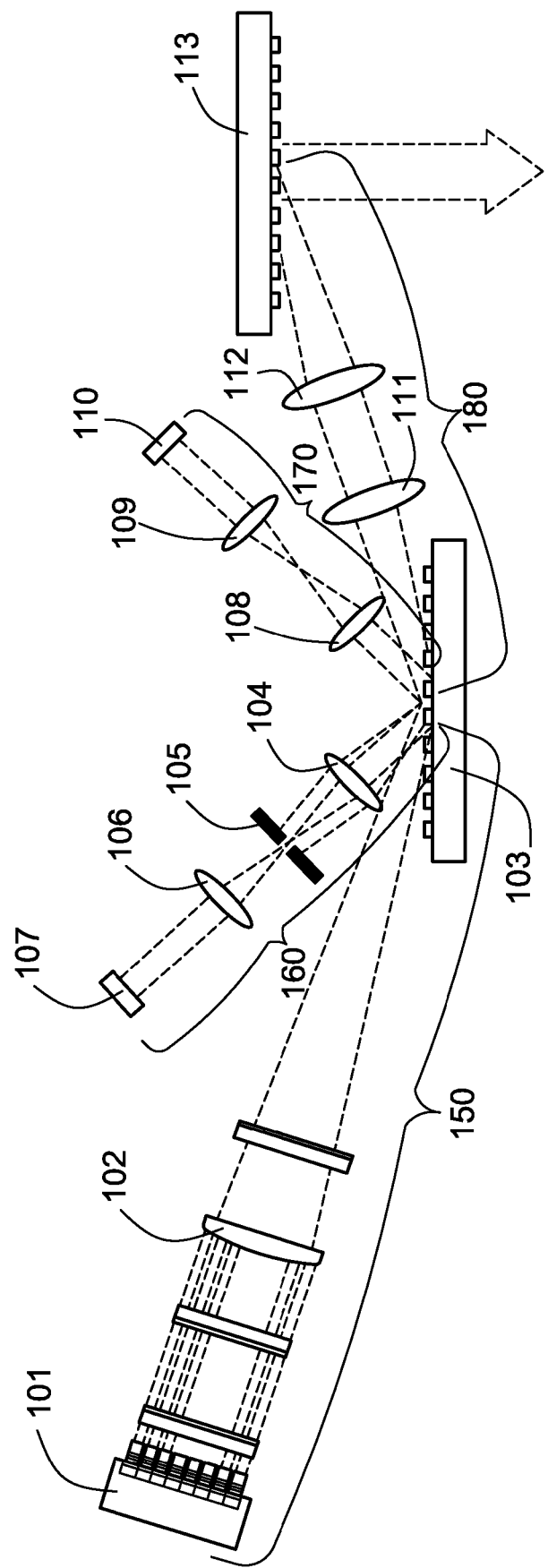
FIG. 1 illustrates an apparatus for producing a single, multi-wavelength output laser beam comprising a plurality of spatially and directionally overlapped single wavelength beams.

FIG. 1 illustrates an apparatus for producing a single, multi-wavelength output laser beam comprising a plurality of spatially and directionally overlapped single wavelength beams. The apparatus depicted in FIG. 1 utilizes a reflection diffraction element to couple a plurality of single wavelength beams, each of which is emitted by an individual emitter in a beam emitter array. The apparatus depicted in FIG. 1 includes a laser source 101 and an output combining element 113. The laser source 101 includes a plurality of laser emitters. In various implementations, the laser source 101 may be a one dimensional array of diode laser emitters, a two dimensional array of diode laser emitters, or a one of a variety of additional configurations of laser emitters. The apparatus depicted in FIG. 1 further includes four optical path arms: an emitter array transformation arm 150, a first feedback branch arm 160, a second feedback branch arm 170, and an output arm 180. The emitter array transformation arm 150, the first feedback branch arm 160, and the second feedback branch arm 170 together define an external resonator cavity. The external resonator cavity provides feedback to the laser source 101 in order to stabilize the wavelength of the beams emitted by the laser source 101. Feedback efficiency of the external resonator cavity is defined as the ratio of optical power coupled into a waveguide of an emitter in the laser source to the total optical power transmitted through the external resonator cavity and towards the laser source 101. It is preferably to achieve high feedback efficiency in order to stabilize the wavelengths of the beams emitted by the plurality of emitters in the laser source. Specifically, the feedback efficiency should be in excess of thirty percent and preferably in excess of seventy percent.

The apparatus depicted in FIG. 1 further includes a position-to-angle transformation element 102, a first reflection diffraction element 103, a first optic 104 and a second optic 106 of a first feedback branch arm telescope, a filtering element 105, a first highly reflective mirror 107 of the first feedback branch arm, a first optic 108 and a second optic 109 of a second feedback branch arm telescope, a second highly reflective mirror 110 of the second feedback branch arm, and a first optic 111 and a second optic 112 of an output arm telescope. In the embodiment depicted in FIG. 1, the first optic 104 and the second optic 106 of the first feedback branch arm and the first optic 108 and the second optic 109 of the second feedback branch arm are Fourier lenses. However, in alternative implementations, Fresnel lenses and various mirror configurations may be utilized.

In the apparatus depicted in FIG. 1, the first reflection diffraction element 103 functions as a resonant feedback component coupling element, while the second reflection diffraction grating functions as a beam combining element for the output beam. Other implementations of the invention may utilize a variety of different external resonator and beam combining system configurations. Alternative configurations may include, but are not limited to, configurations having optical paths with three branches (such as the resonator and beam coupler depicted in FIG. 3) as well as configurations having optical paths with five branches or with any other number of branches. Alternative configurations may also include, but are not limited to, configurations utilizing a reflection diffraction grating with a high diffraction efficiency in the first order for both resonant feedback component coupling and output beam combining (such as the resonator and beam combining apparatus depicted in FIG. 5).

Figure 2:
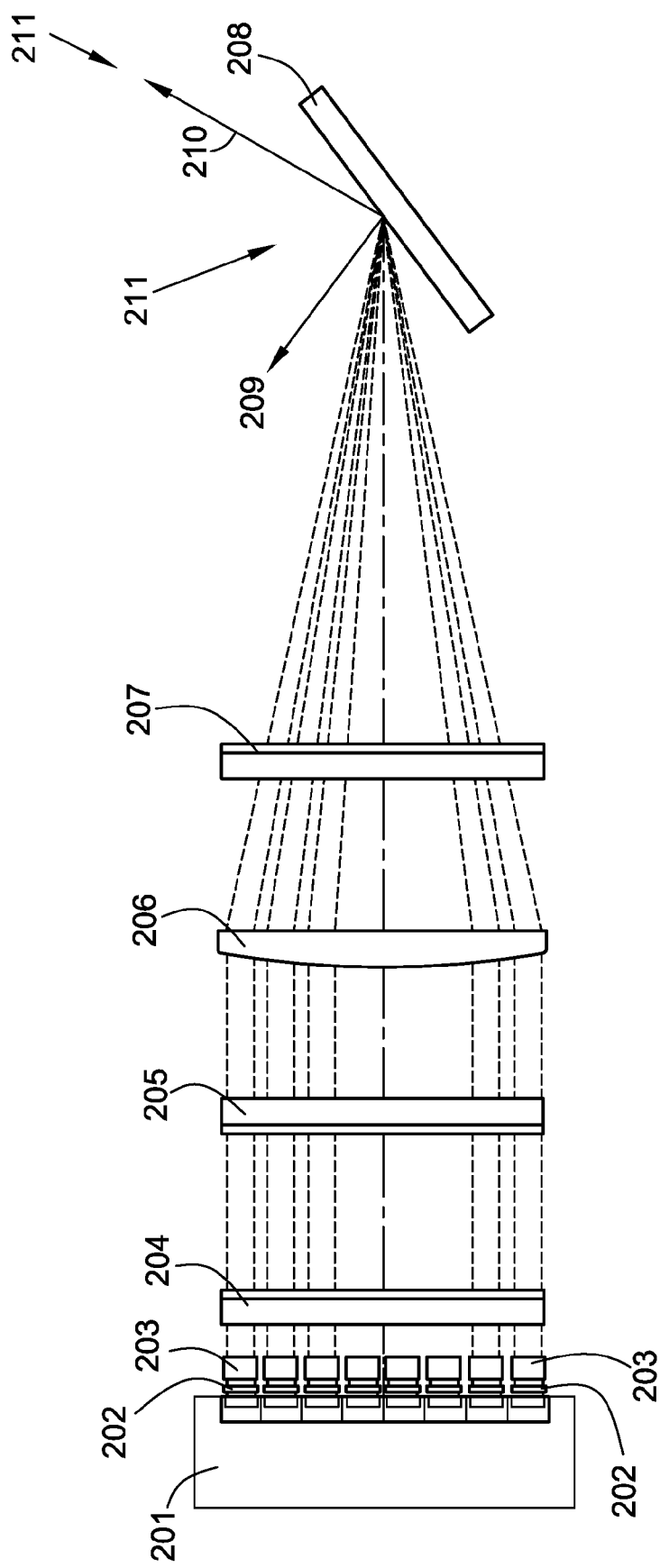
FIG. 2 illustrates an array of beam emitters and an emitter array transformation arm of an interferometric external resonator.

FIG. 2 illustrates an array of beam emitters and an emitter array transformation arm of an interferometric external resonator. The emitter array 201 depicted in FIG. 2 is an array of diode laser emitters. The array of diode laser emitters may comprise a stack of diode bars, where each bar has a plurality of emitters. The array can also be either one-dimensional or two-dimensional. Typically, each emitter in the diode bar has an asymmetric beam profile for which two axes perpendicular to the direction in which the beam propagates can be defined. The two axes can be identified as a fast axis and a slow axis and are also perpendicular to each other. The laser beam will diverge more rapidly along the fast axis and more slowly along the slow axis. In alternative implementations, the emitter array 201 may comprise a plurality of gas lasers, chemical lasers, excimer lasers, solid-state lasers, photonic crystal lasers, dye lasers, or any other type of laser source.

A plurality of cylindrical fast-axis collimation optics 202 collimate each of the beams emitted by the diode laser emitters in the array of diode laser emitters 201 along the fast axis. A plurality of beam rotators 203 rotates each of the beams emitted by the diode laser emitters in the array of diode laser emitters 201. Each beam rotator rotates its respective beam by ninety degrees in a direction perpendicular to the direction of propagation. Alternatively the device can be set up without using beam rotators. In this case it might be advantageous to use slow axis collimation lens arrays to increase the optical filling factor in the slow axis.

A cylindrical slow-axis collimation optic 204 collimates each of the rotated beams emerging from the plurality of beam rotators 203 along the beams slow axis. A position-to-angle transformation element 206 transforms the spatial distribution of the beams emitted by the diode laser emitters in the array of diode laser emitters 201 to an angular distribution. The position-to-angle transformation element 206 may be a lens, a prismatic object, or any other element than can impart an angle of transmission upon a beam that is determined by the position at which the beam is incident upon the element. The position-to-angle transformation element 206 imparts each beam emitted by the array of diode laser emitters 201 and emerging from the first cylindrical slow axis telescope optic 205 with an angle of incidence with respect to a reflection diffraction grating 208. In some implementations, the angle of incidence imparted by the position-to-angle transformation element 206 is selected such that all of the beams will be spatially and directionally overlapped after being diffracted from the reflection diffraction grating 208 as diffracted emitter array transformation arm output 209. Alternatively, the angle of incidence imparted by the position-to-angle transformation element 206 is selected such that reflected emitter array transformation arm output 210 will be spatially and directionally overlapped after being diffracted by a subsequent diffraction element. In some implementations, the array of diode beam emitters 201 is positioned such that each emitter in the array is located at a particular angle with respect to the reflection diffraction grating 208. In such implementations, each emitter emits a beam at the desired angle with respect to the reflection diffraction grating 208 and therefore a position-to-angle transformation element need not be included in the system.

When the emitter array transformation arm depicted in FIG. 2 is configured within a resonator cavity, a resonant feedback component 211 traverses the emitter array transformation arm in the reverse direction. Depending upon the configuration of the other components of the resonator cavity, the resonant feedback component 211 incident upon the reflection diffraction grating 208 may either be a multi-spectral beam consisting of a plurality of individual, single wavelength beams that are spatially and directionally overlapped, or the resonant feedback beam 211 may consist of a plurality of individual, single-wavelength beams having an angular spectrum. In the former case, the reflection diffraction grating 208 will diffract the resonant feedback component 211 and thereby transform the wavelength spectrum of the incident beam into an angular spectrum. In the latter case, the reflection diffraction grating 208 will reflect the resonant feedback component 211 and preserve the preexisting angular spectrum. In either case, the resonant feedback component 211 will comprise a plurality of single wavelength beams and will have an angular spectrum upon reaching the position-to-angle transformation element 206. In the direction in which the resonant feedback component propagates, the position-to-angle transformation element 206 will act as an angle-to-position transformation element and impart a positional spectrum upon the resonant feedback component. The positional spectrum corresponds to the positional arrangement of each of the emitters in the array of diode laser emitters 201. In the emitter array transformation arm depicted in FIG. 2, the feedback efficiency is the ratio of the optical power coupled into a waveguide of an emitter in the array of diode laser emitters 201 to the total optical power carried by the resonant feedback component 211.

Figure 3:
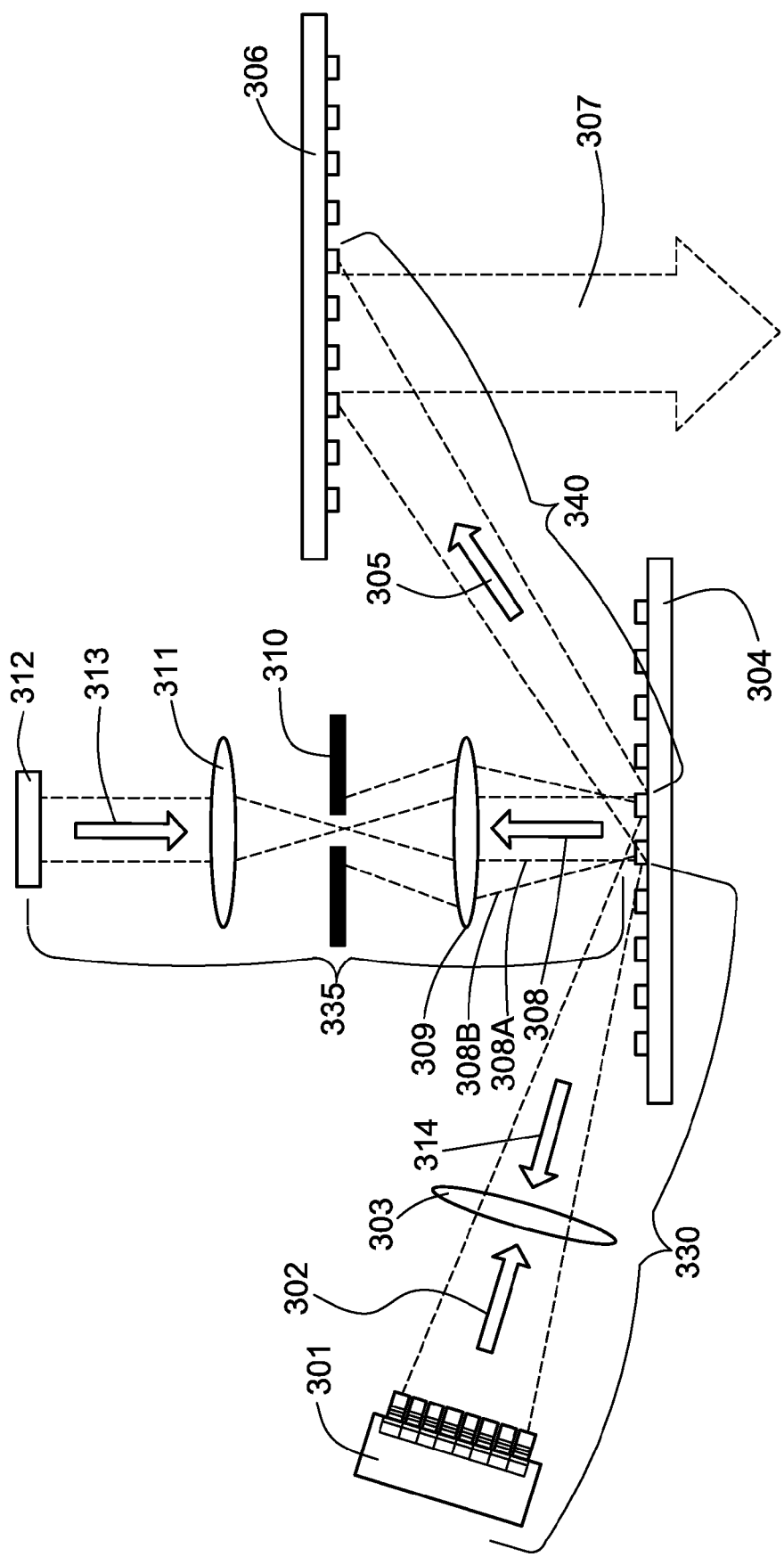
FIG. 3 illustrates an interferometric external resonator and beam combining apparatus that utilizes a reflection diffraction element to provide resonant feedback for beam wavelength stabilization and to combine multiple single-wavelength beams into a combined, multi-wavelength output beam.

FIG. 3 illustrates an interferometric external resonator and beam combining apparatus that utilizes a reflection diffraction element to provide resonant feedback for beam wavelength stabilization. FIG. 3 illustrates an interferometric external resonator having two optical path arms: an emitter beam transformation arm 330 and a feedback arm 335. The apparatus also has a third optical path arm (output arm 340) which is not part of the external resonator. A laser source 301 is positioned at a first terminus of the emitter beam transformation arm 330. The laser source 301 includes a plurality of emitters located at fixed positions with respect to one another. The position of each one of the plurality of emitters defines a point in an emitter spatial position distribution. The laser source 301 emits a plurality of single wavelength, i.e. narrow spectral bandwidth, input beams that together constitute an external resonator input 302.

Upon exiting the laser source, the external resonator input 302 has a position spectrum that corresponds to the emitter spatial position distribution. The position spectrum maps each constituent beam of the external resonator input 302 to a particular emitter of the laser source 301. The external resonator input 302 propagates from the laser source towards a first reflection diffraction element 304 through a position-to-angle transformation element 303. The position-to-angle transformation element 303 imparts an angle of incidence with respect to the first reflection diffraction element 304 upon each constituent beam wherein the angles of incidence correspond to the spatial positions of the constituent beams. The position-to-angle transformation element 303 thereby transforms the position spectrum of the external resonator input 302 into an angular spectrum. Thus, upon emerging from the position-to-angle transformation element 303, the external resonator input 302 possesses an angular spectrum. In the embodiment depicted in FIG. 3, the position-to-angle transformation element 303 is a Fourier lens. However, in alternative embodiments a variety of alternative transformation optics, including Fresnel lenses, mirror arrangements, prismatic objects, and diffractive gratings may be utilized as the position-to-angle transformation element 303.

After propagating through the position-to-angle transformation element 303, the external resonator input 302 is split into separate components upon striking the first reflection diffraction element 304. In the embodiment depicted in FIG. 3, the first reflection diffraction element 304 is a low diffraction efficiency diffraction grating. Therefore, the majority of the power of an incident beam emerges from the interaction with the first reflection diffraction element as a reflection, while a substantially smaller component emerges as a diffraction. In the embodiment depicted in FIG. 3, it is preferably that substantially all of the power of an incident beam emerge from the interaction with the diffraction grating as either a zero order diffraction (a reflection) or a first order diffraction. Furthermore, it is preferable that the optical power carried by the reflection is at least four times the optical power carried by the diffraction. In other words, in the embodiment depicted in FIG. 3, it is desirable to select a diffraction grating that exhibits a first order diffraction efficiency of less than twenty percent and that simultaneously exhibits a zero order diffraction efficiency of greater than eighty percent.

A first component emerging from the interaction between the external resonator arm input 302 and the first reflection diffraction element 304 is a reflection that constitutes an output arm input 305. The output arm input 305 consists of a plurality of single wavelength constituent beams that emerge from the interaction at various angles relative to one another. In other words, the output arm input 305 possesses an angular spectrum that is a reflection of the angular spectrum imparted upon the external resonator input 302 by the position-to-angle transformation element 303. After emerging from the first reflection diffraction element 304, the output arm input 305 strikes a second reflection diffraction element 306.

The second reflection diffraction element 306 is a high efficiency beam combining reflection diffraction grating. The second reflection diffraction element reflectively diffracts the output arm input 305 thereby converting the output arm input into a multi-spectral combined output beam 307. The second reflection diffraction element exhibits extremely high first order diffraction efficiency. In practice, reflection diffraction gratings can achieve diffraction efficiencies of up to 99.8%. The use of a reflective diffraction element that exhibits very high diffraction efficiency results in very little loss in output power attributable to the output combining element and thereby enhances the wall-plug efficiency of the overall system.

The multi-spectral combined output beam 307 is composed of a plurality of spatially and directionally overlapped single wavelength beams, which are portions of the beams emitted from the plurality of emitters of the laser source 301. In order to ensure that all constituent beams of the multi-wavelength combined output beam 307 share a common direction of propagation, the relative positions of the laser source 301, the position-to-angle transformation element 303, the first reflection diffraction grating 304, the first and second output arm lenses 306 and 307, and the second reflection diffraction element 306 must be fixed at precise positions with respect to one another. Specifically, the optical components must be positioned such that the components of the plurality of single wavelength beams emitted from the laser source 301 that reach the second reflection diffraction element 306 emerge from an overlap region of the second reflection diffraction element 306 with a common direction of propagation.

A second component emerging from the interaction between the external resonator input 302 and the first reflection diffraction element 304 is a diffraction that constitutes a feedback arm input 308. The feedback arm input 308 includes a preferred resonant mode component 308A and an alternative resonant mode component 308B. The preferred resonant mode component 308A is a combined beam composed of a plurality of spatially and directionally overlapped single wavelength constituent beams. The constituent beams of the preferred resonant mode component 308A are reflective diffractions of the constituent beams of the external resonator input 302. The constituent beams of the preferred resonant mode component 308A are parallel, i.e. they emerge from the first reflection diffraction element 304 with a common direction of propagation. Each constituent beam of the preferred resonant mode component 308A is composed of electromagnetic radiation corresponding to a preferred resonant mode of an emitter of the laser source 301. The alternative resonant mode component 308B is composed of a plurality of single wavelength constituent beams that emerge from the first reflection diffraction element 304 at various angles with respect to the common direction of propagation of the preferred mode component 308A. Thus, the constituent beams of the alternative resonant mode component 308B are not spatially and directionally overlapped with respect to each other or with respect to the constituent beams of the preferred mode component 308A. In other words, the alternative resonant mode component 308B has a broader angular spectrum than the preferred mode component 308A. Consequently, alternative resonant mode component 308B will contribute to a worsening of beam quality. Each constituent beam of the alternative resonant mode component 308B is composed of electromagnetic radiation corresponding to an alternative, non-preferred mode of an emitter of the laser source 301. If the alternative resonant mode component 308B is allowed to propagate through the feedback arm and return to the laser source 301, the alternative resonant mode component may stimulate the emission of undesired spectral components from the laser source 301. A portion of such undesired spectral components will be transmitted out of the system and cause a deterioration in the beam quality of the multi-wavelength combined output beam 307.

After emerging from the first reflection diffraction grating 304, the feedback arm input 308 travels through a first lens 309 of a feedback arm telescope. The first lens 309 of the feedback arm telescope directs the preferred mode component 308A through a spatial filtering element 310 but directs the alternative resonant mode component 308B at the spatial filtering element 310 in a manner that causes the spatial filtering element to block the alternative resonant mode component 308B. In this manner, the alternative resonant mode component 308B is filtered out of the external resonator and prevented from being returned to the laser source 301 and thereby prevented from exciting alternative resonant modes of the emitters of the laser source 301. The electromagnetic radiation composing the alternative resonant mode component 308B may be absorbed by the material composing the spatial filtering element 310, or may be reflected from or transmitted through the spatial filtering element 310 in a manner such that it is diverted from the optical path defining the external resonator. In various implementations, the spatial filtering element may be a waveguide structure, a set of mirrors that have a gradient layer, or an aperture, e.g., a diaphragm.

After passing through the spatial filtering element 310, the preferred mode component 308A propagates through a second lens 311 of the feedback arm telescope and towards a feedback arm highly reflective mirror 312. The preferred mode component 308A is reflected from the feedback arm highly reflective mirror 312 as feedback arm output 313. Feedback arm output 313 is a combined beam composed of a plurality of single wavelength constituent beams, wherein each constituent beam is composed of electromagnetic radiation corresponding to a preferred resonant mode of an emitter of the laser source 301. After reflecting from the feedback arm highly reflective mirror 312, the constituent beams of the feedback arm output 313 travel in a reverse direction through the second lens 311 of the feedback arm telescope, through the spatial filtering element 310, and through the first lens 309 of the feedback arm telescope. Thereafter, the constituent beams of the feedback arm output strike the first reflection diffraction element 304. Upon striking the first reflection diffraction element 304, the feedback arm output 313 is split into multiple separate components.

A first component emerging from the interaction between the feedback arm output 313 and the first reflection diffraction element 304 is a reflection that constitutes additional feedback arm input 308. The additional feedback arm input 308 is a combined beam composed of a plurality of parallel, e.g., directionally overlapped, and spatially overlapped single wave length beams. A second component emerging from the interaction between the feedback arm output 313 and the first reflection diffraction element 304 is a negative first order diffraction that constitutes additional output arm input 305. A third component emerging from the interaction between the feedback arm output 313 and the first reflection diffraction element 304 is a first order diffraction that constitutes laser source resonant feedback 314. In the embodiment depicted in FIG. 3, the feedback efficiency is the ratio of the optical power coupled into waveguides of laser source 301 to the total optical power carried by the laser source resonant feedback 314. In order to promote wavelength stabilization of the emitters of the laser source 301, the feedback efficiency should be thirty percent or greater, and preferably greater than seventy percent. The diffraction of the feedback arm output 313 at the first reflective diffraction grating 304 imparts an angular spectrum onto the laser source resonant feedback 314. Specifically, the first reflective diffraction grating imparts an angle of diffraction upon each of the constituent beams of the laser source resonant feedback 314. The laser source resonant feedback 314 propagates through the position-to-angle transformation element 303 towards the laser source 301 in a direction of propagation that is opposite to the direction of the external resonator input 302. The position-to-angle transformation element 303 transforms the angular spectrum of the laser source resonant feedback 314 into a position spectrum that corresponds to the spatial distribution of the plurality of emitters in the laser source 301. Thus, the position-to-angle transformation element 303 directs each constituent beam of the laser source resonant feedback 314 into a single emitter of the laser source 301 thereby stimulating emission of electromagnetic radiation corresponding to the preferred resonant mode of each emitter of the laser source 301.

Figure 4:
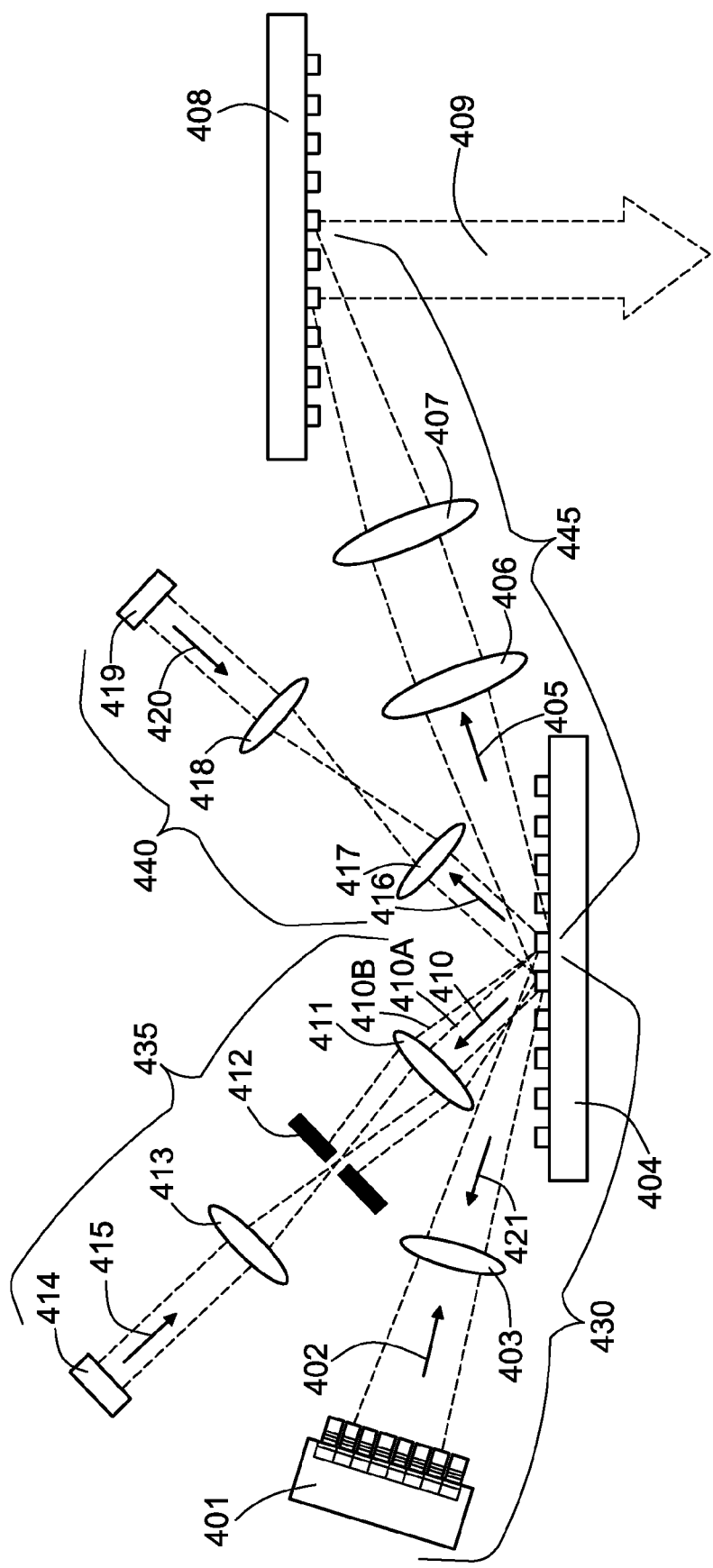
FIG. 4 illustrates an alternative interferometric external resonator and beam combining apparatus that utilizes reflection diffraction elements to provide resonant feedback for beam wavelength stabilization and to combine multiple single-wavelength input beams into a combined, multi-wavelength output beam.

FIG. 4 illustrates an alternative interferometric external resonator and beam combining apparatus that utilizes reflection diffraction elements to provide resonant feedback for beam wavelength stabilization and to combine multiple single-wavelength input beams into a combined, multi-wavelength output beam. FIG. 4 illustrates an interferometric external resonator having three optical path arms: an emitter beam transformation arm 430, a first feedback arm 435, and a second feedback arm 440. The apparatus depicted in FIG. 4 also includes a fourth optical path arm (output arm 445) which is not part of the interferometric external resonator. A laser source 401 is positioned at a first terminus of the emitter beam transformation arm 430. The laser source 401 includes a plurality of emitters located at fixed positions with respect to one another. The position of each one of the plurality of emitters defines a point in the emitter spatial position distribution. The laser source 401 emits a plurality of single wavelength, i.e. narrow spectral bandwidth, input beams that together constitute an external resonator input 402.

Upon exiting the laser source, the external resonator input 402 has a position spectrum that corresponds to the emitter spatial position distribution. The external resonator input 402 propagates from the laser source 401 towards a first reflection diffraction element 404 through a position-to-angle transformation element 403. The position-to-angle transformation element 403 imparts an angle of incidence with respect to the first reflection diffraction element 404 upon each constituent beam of the external resonator input 402. The imparted angles of incidence correspond to the spatial position of the constituent beams and thus to the spatial position of the emitters in the laser source 401. The position-to-angle transformation element 403 thereby transforms the position spectrum of the external resonator input 402 into an angular spectrum. Therefore, upon emerging from the position-to-angle transformation element 403, the external resonator input 402 possesses an angular spectrum. In the embodiment depicted in FIG. 4, the position-to-angle transformation element 403 is a Fourier lens. However, in alternative embodiments a variety of alternative transformation optics, including Fresnel lenses, mirror arrangements, prismatic objects, and diffractive gratings may be utilized as the position-to-angle transformation element 403.

After propagating through the position-to-angle transformation element 403, the external resonator input 402 interacts with the first reflection diffraction element 404. In the embodiment depicted in FIG. 4, the first reflection diffraction element 404 is a low diffraction efficiency diffraction grating. Therefore, the majority of the power of an incident beam emerges from the interaction with the first reflection diffraction element as a reflection, while a substantially smaller component emerges as a diffraction. In the embodiment depicted in FIG. 4, it is preferably that substantially all of the power of an incident beam emerge from the interaction with the diffraction grating as either a zero order diffraction (in which the beam reflected) or a first order diffraction. Furthermore, it is preferable that the optical power carried by the reflection is at least four times the optical power carried by the diffraction. In other words, in the embodiment depicted in FIG. 4, it is desirable to select a diffraction grating that exhibits a first order diffraction efficiency of less than twenty percent and that simultaneously exhibits a zero order diffraction efficiency of greater than eighty percent.

A first component emerging from the interaction between the external resonator arm input 402 and the first reflection diffraction element 404 is a reflection that constitutes an output arm input 405. The output arm input 405 is made up of a plurality of constituent beams and possesses an angular spectrum that is a reflection of the angular spectrum imparted upon the external resonator input 402 by the position-to-angle transformation element 403. After emerging from the first reflection diffraction element 404, the output arm input 405 travels through a first output arm telescope lens 406 and a second output arm telescope lens 407 before striking a second reflection diffraction element 408.

The second reflection diffraction element 408 is a high efficiency reflection diffraction element that acts as a beam combining element for the output beam. Reflection diffraction elements can attain diffraction efficiencies considerably greater than those that transmission diffraction elements can attain. Therefore, the use of reflection diffraction elements provides increased wall-plug efficiency by reducing power loss attributable to output beam combining. The output arm input 405 is converted into a multi-spectral combined output beam 409 via interaction with the second reflection diffraction element 408. The multi-spectral combined output beam 409 consists of a plurality of spatially overlapped constituent beams that are diffractions of the constituent beams of the output arm input 405. Furthermore, the constituent beams of the multi-spectral combined output beam are directionally overlapped, i.e., they share a common direction of propagation. In order to ensure that the constituent beams of the combined output beam are spatially overlapped and parallel, the relative positions of the laser source 401, the position-to-angle transformation element 403, the first reflection diffraction grating 404, the first and second output arm lenses 406 and 407, and the second reflection diffraction element 408 are fixed at precise positions with respect to one another.

A second component emerging from the interaction between the external resonator arm input 402 and the first reflection diffraction element 404 is a diffraction that constitutes a first feedback arm input 410. The first feedback arm input 410 includes a preferred resonant mode component 410A and an alternative resonant mode component 410B. The preferred resonant mode component 410A is a combined beam composed of a plurality of spatially and directionally overlapped single wavelength constituent beams that emerge from the first reflection diffraction element 404 with a common direction of propagation. The constituent beams of the preferred resonant mode component 410A are reflective diffractions of the constituent beams of the external resonator input 402. Each constituent beam of the preferred resonant mode component 410A is composed of electromagnetic radiation corresponding to a preferred resonant mode of an emitter of the laser source 401. The alternative resonant mode component 410B is composed of a plurality of single wavelength constituent beams that emerge from the first reflection diffraction element 404 at various angles with respect to the common direction of propagation of the preferred mode component 410A. Thus, the constituent beams of the alternative resonant mode component 410B are not spatially and directionally overlapped with respect to each other or with respect to the constituent beams of the preferred mode component 410A. In other words, the alternative resonant mode component 410B has a wider angular spectrum. Each constituent beam of the alternative resonant mode component 410B is composed of electromagnetic radiation corresponding to an alternative, non-preferred mode of an emitter of the laser source 401. In other words, the alternative resonant mode components 410B is made up of unwanted spectral components of the first feedback arm input 410.

After emerging from the first reflection diffraction grating 404, the first feedback arm input 410 travels through a first lens 411 of a first feedback arm telescope. The first lens 411 of the first feedback arm telescope directs the preferred mode component 410A through a spatial filtering element 412 but directs the alternative resonant mode component 410B into the spatial filtering element 412 such that it is diverted from the optical path defining the external resonator. In this manner, the alternative resonant mode component 410B is filtered out of the external resonator and prevented from being returned to the laser source and thereby prevented from exciting alternative resonant modes of the emitters of the laser source 401. The electromagnetic radiation composing the alternative resonant mode component 410B may be absorbed by the material composing the spatial filtering element 412, or may be reflected from or transmitted through the spatial filtering element 412 in a manner such that it is diverted from the optical path defining the external resonator.

After passing through the spatial filtering element, the preferred mode component 410A propagates through a second lens 413 of the first feedback arm telescope and towards a first feedback arm highly reflective mirror 414. The preferred mode component 410A is reflected from the first feedback arm highly reflective mirror 414 as first feedback arm output 415. First feedback arm output 415 is a combined beam composed of a plurality of single wavelength constituent beams. Each constituent beam of the first feedback arm output 415 is composed of electromagnetic radiation corresponding to a preferred resonant mode of an emitter of the laser source 401. After reflecting from the first feedback arm highly reflective mirror 414, the constituent beams of the first feedback arm output 415 travel in a reverse direction through the second lens 413 of the first feedback arm telescope, through the spatial filtering element 412, and through the first lens 411 of the first feedback arm telescope until they strike the first reflection diffraction element 404. Upon striking the first reflection diffraction element 404, the first feedback arm output 415 is split into separate components.

A first component of the first feedback arm output 415 emerging from the first reflection diffraction element 404 is a reflection that constitutes a second feedback arm input 416. The second feedback arm input 416 propagates through a first lens 417 and a second lens 418 of a second feedback arm telescope and towards a second feedback arm highly reflective mirror 419. The second feedback arm input 416 is reflected from the second feedback arm highly reflective mirror 419 as second feedback arm output 420. After reflecting from the second feedback arm highly reflective mirror 419, the constituent beams of the second feedback arm output 420 travel in a reverse direction through the second lens 418 and the first lens 417 of the second feedback arm telescope until they strike the first reflection diffraction element 404. Upon striking the first reflection diffraction element 404, the second feedback arm output 420 is split into separate components. A first component is a reflection that serves as additional first feedback arm input 410. Therefore, a component of the beams continues traveling back and forth through the first feedback arm 435 and the second feedback arm 440. Thus, an interferometer is formed by the first feedback arm highly reflective mirror 414, the second feedback arm highly reflective mirror 419, and the first reflection diffraction element 404. A second component is a reflective diffraction that serves as additional output arm input 405.

A second component of the first feedback arm output 415 emerging from the first reflection diffraction element 404 is a first order diffraction that constitutes laser source resonant feedback 421. The diffraction of the first feedback arm output 415 at the first reflective diffraction grating 404 imparts an angular spectrum onto the laser source resonant feedback 421. The laser source resonant feedback 421 propagates through the position-to-angle transformation element 403 towards the laser source 401 in a direction of propagation that is opposite that of the external resonator input 402. In the embodiment depicted in FIG. 4, the feedback efficiency is the ratio of the optical power coupled into waveguides of laser source 401 to the total optical power carried by the laser source resonant feedback 421. In order to promote wavelength stabilization of the emitters of the laser source 401, the feedback efficiency should be thirty percent or greater, and preferably greater than seventy percent. The position-to-angle transformation element 403 transforms the angular spectrum of the laser source resonant feedback into a position spectrum that corresponds to the position of each emitter in the laser source 401. In that manner, each constituent beam of the laser source resonant feedback 421 is directed into a single emitter of the laser source 401 thereby stimulating emission of electromagnetic radiation corresponding to the preferred resonant mode of each emitter of the laser source 401.

Figure 5:
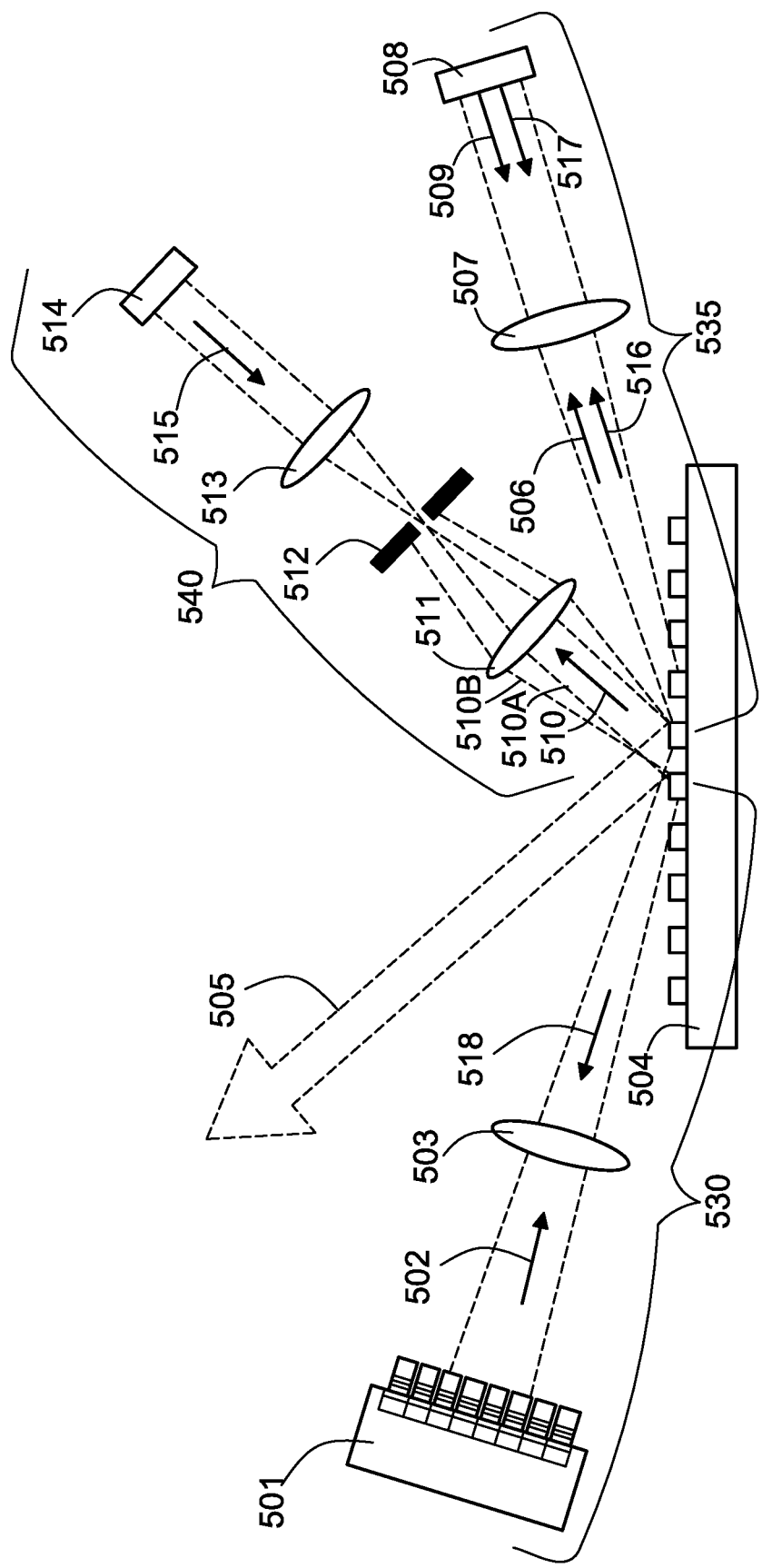
FIG. 5 illustrates an interferometric external resonator and beam combining apparatus that utilizes a high diffraction efficiency reflection diffraction element to provide resonant feedback for beam stabilization and to combine multiple single wavelength input beams into a combined, multi-spectral output beam.

FIG. 5 illustrates an interferometric external resonator and beam combining apparatus that utilizes a high diffraction efficiency reflection diffraction element to provide resonant feedback for beam stabilization and to combine multiple single wavelength input beams into a combined, multi-spectral output beam. FIG. 5 illustrates an interferometric external resonator having three optical path arms: an emitter beam transformation arm 530, a first feedback arm 535, and a second feedback arm 540. A laser source 501 is positioned at a first terminus of the emitter beam transformation arm 530. The laser source 501 includes a plurality of emitters located at fixed positions with respect to one another. The position of each one of the plurality of emitters defines a point in an emitter spatial position distribution. The laser source 501 emits a plurality of single wavelength, i.e. narrow spectral bandwidth, input beams that together constitute an external resonator input 502. Upon exiting the laser source, the external resonator input 502 has a position spectrum that corresponds to the emitter spatial position distribution. This enables each constituent beam of the external resonator input 502 to be mapped to a particular emitter of the laser source 501 by its spatial position. The external resonator input 502 propagates from the laser source towards a reflection diffraction element 504 through a position-to-angle transformation element 503.

The position-to-angle transformation element 503 maps a position of each single wavelength input beam to an angle of incidence with respect to the reflection diffraction element 504. The position-to-angle transformation element 503 thereby transforms the position spectrum of the external resonator input 502 into an angular spectrum. Thus, upon emerging from the position-to-angle transformation element 503, the external resonator input 502 possesses an angular spectrum. Specifically, after emerging from the position-to-angle transformation element 503, each constituent beam of the external resonator input 502 and its corresponding emitter may be identified by an angle of incidence with respect to the diffraction element 504. In the embodiment depicted in FIG. 5, the position-to-angle transformation element 503 is a Fourier lens. However, in alternative embodiments a variety of alternative transformation optics, including Fresnel lenses, mirror arrangements, prismatic objects and diffractive gratings may be utilized as the position-to-angle transformation element 503.

After propagating through the position-to-angle transformation element 503, the external resonator input 502 is split into separate components upon striking the first reflection diffraction element 504. In the embodiment depicted in FIG. 5, the reflection diffraction element 504 is a high efficiency diffraction grating that acts as both an output combining element and a resonant feedback arm coupling element. Therefore, the majority of the power of an incident beam emerges from the interaction with the first reflection diffraction element as a diffraction, while a substantially smaller component emerges as a reflection. In the embodiment depicted in FIG. 5, it is preferably that substantially all of the power of an incident beam emerges from the interaction with the diffraction grating as either a zero order diffraction or a first order diffraction. Furthermore, it is preferable that the optical power carried by the first order diffraction is at least four times the optical power carried by the zero order diffraction. In other words, in the embodiment depicted in FIG. 5, it is desirable to select a diffraction grating that exhibits a first order diffraction efficiency of greater than 80% and simultaneously exhibits a zero order diffraction efficiency of less than 20%.

A first component of the external resonator arm input 502 emerging from the reflection diffraction element 504 is a reflective diffraction of the resonator arm input 505 that constitutes a system output 505. The system output 505 is composed of a plurality of spatially and directionally overlapped single wavelength beams emitted from the plurality of emitters of the laser source 501. The spatial locations of the laser source 501, the position-to-angle transformation element 503, and the reflection diffraction element 504 are fixed at precise positions with respect to one another such that the components of the plurality of single wavelength beams emitted from the laser source 501 that are emitted as system output 505 emerge from an overlap region of the reflection diffraction element 504 with a common direction of propagation.

A second component of the external resonator arm input 502 emerging from the reflection diffraction element 504 is a reflection that constitutes a first feedback arm input 506. The first feedback arm input 506 consists of a plurality of single wavelength constituent beams. The first feedback arm input 506 possesses an angular spectrum that is a reflection of the angular spectrum imparted upon the external resonator arm input 502 by the position-to-angle transformation element 503. After emerging from the reflection diffraction element 504, the first feedback arm input 506 travels through a first feedback arm lens 507. The first feedback arm lens 507 directs the constituent beams of the first feedback arm input 506 at a first feedback arm high-reflective mirror 508. Upon striking the first feedback arm high-reflective mirror 508, the constituent beams of the first feedback arm input 506 are reflected as first feedback arm output 509. The first feedback arm output travels back through the first feedback arm lens 507 and strikes the reflective diffraction grating 504, which splits the first feedback arm output 509 into separate components.

A first component of the first feedback arm output 509 emerging from the reflection diffraction element is a reflection that constitutes unfiltered laser source resonant feedback 518. A second component of the second feedback arm output 509 emerging from the reflection diffraction element is a reflective diffraction that constitutes second feedback arm input 510. The second feedback arm input 510 includes a preferred resonant mode component 510A and an alternative resonant mode component 510B. The preferred resonant mode component 510A is composed of a plurality of spatially and directionally overlapped single wavelength constituent beams that emerge from the reflection diffraction element 504 with a common direction of propagation. Each constituent beam of the preferred resonant mode component 510A is composed of electromagnetic radiation corresponding to a preferred resonant mode of an emitter of the laser source 501. The alternative resonant mode component 510B is composed of a plurality of single wavelength constituent beams that emerge from the reflection diffraction element 504 at an angle with respect to the common direction of propagation of the preferred mode component 510A. Thus, the constituent beams of the alternative resonant mode component 510B are not spatially and directionally overlapped with respect to each other or with respect to the constituent beams of the preferred mode component 510A. Each constituent beam of the alternative resonant mode component 510B is composed of electromagnetic radiation corresponding to an alternative, non-preferred mode of an emitter of the laser source 501. In other words, the alternative resonant mode component 510B consists of the unwanted spectral components of the second feedback arm input 510.

After emerging from the reflection diffraction grating 504, the second feedback arm input 510 travels through a first lens 511 of a second feedback arm telescope. The first lens 511 of the second feedback arm telescope directs the preferred mode component 510A through a spatial filtering element 512 but directs the alternative resonant mode component 510B at from spatial filtering element 512 such that it is removed from the optical path defining the external resonator. In this manner, the alternative resonant mode component 510B is filtered out of the external resonator and prevented from being returned to the laser source and thereby prevented from exciting alternative resonant modes of the emitters of the laser source 501. The electromagnetic radiation composing the alternative resonant mode component 510B may be absorbed by the material composing the spatial filtering element 512, or may be reflected from or transmitted through the spatial filtering element 512 in a manner such that it is diverted from the optical path defining the external resonator.

After passing through the spatial filtering element, the preferred mode component 510A propagates through a second lens 513 of the second feedback arm telescope and towards a second feedback arm highly reflective mirror 514. The preferred mode component 510A is reflected from the second feedback arm highly reflective mirror 514 as second feedback arm output 515. Second feedback arm output 515 is a combined beam composed of a plurality of single wavelength constituent beams, wherein each constituent beam is composed of electromagnetic radiation corresponding to a preferred resonant mode of an emitter of the laser source 501. After reflecting from the second feedback arm highly reflective mirror 514, the constituent beams of the second feedback arm output 515 travel in a reverse direction through the second lens 513 of the second feedback arm telescope, through the spatial filtering element 512, and through the first lens 511 of the second feedback arm telescope until they strike the first reflection diffraction element 504.

Upon striking the first reflection diffraction element 504, the second feedback arm output 515 is split into separate components. A first component is a reflection that serves as additional system output 505. A second component is a diffraction that serves as filtered first feedback arm input 516.

The filtered first feedback arm input 516 traverses the first feedback arm and is reflected from the first feedback arm highly reflective mirror 508 as filtered first feedback arm output 517. The filtered first feedback arm output 517 strikes the reflection diffraction element 504 and is separated into components. A first component of the filtered first feedback arm output 517 emerging from the reflection diffraction element 504 is a reflective diffraction that constitutes additional second feedback arm input 510. Therefore, a component of the beams continues traveling back and forth through the first feedback arm 535 and the second feedback arm 540. Thus, an interferometer is formed by the first feedback arm highly reflective mirror 508, the second feedback arm highly reflective mirror 514, and the first reflection diffraction element 504. A second component of the filtered first feedback arm output 517 emerging from the reflection diffraction element is a reflection that constitutes filtered laser source resonant feedback 518. The laser source resonant feedback 518 propagates through the position-to-angle transformation element 503 towards the laser source 501 in a direction of propagation that is opposite that of the external resonator input 502. The position-to-angle transformation element 503 transforms the angular spectrum of the filtered laser source resonant feedback 518 into a position spectrum that corresponds to the position of each emitter in the laser source 501. In that manner, each constituent beam of the laser source resonant feedback 518 is directed into a single emitter of the laser source 501 thereby stimulating emission of electromagnetic radiation corresponding to the preferred resonant mode of each emitter of the laser source 501. In the embodiment depicted in FIG. 5, the feedback efficiency is the ratio of the optical power coupled into waveguides of laser source 501 to the total optical power carried by the laser source resonant feedback 518. In order to promote wavelength stabilization of the emitters of the laser source 501, the feedback efficiency should be thirty percent or greater, and preferably greater than seventy percent.

Figure 6:
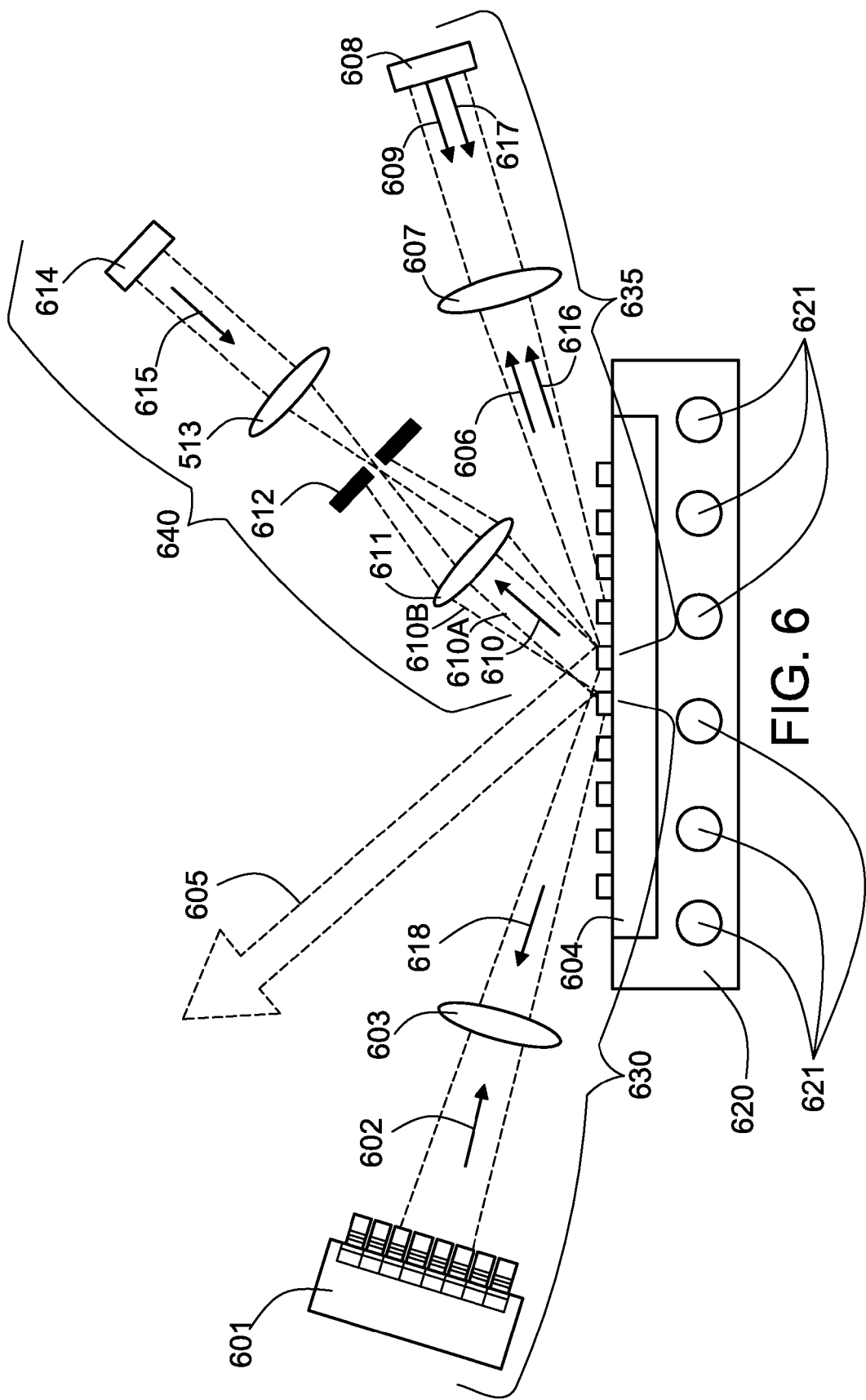
FIG. 6 illustrates an additional interferometric external resonator and beam combining apparatus that utilizes a high diffraction efficiency reflection diffraction element with a backside thermal management system to provide resonant feedback for beam stabilization and to combine multiple single wavelength input beams into a combined, multi-spectral output beam.

FIG. 6 illustrates an additional interferometric external resonator and beam combining apparatus that utilizes a high diffraction efficiency reflection diffraction element with a backside thermal management system to provide resonant feedback for beam stabilization and to combine multiple single wavelength input beams into a combined, multi-spectral output beam. FIG. 6 illustrates an interferometric external resonator and beam coupler having three optical path arms: an emitter beam transformation arm 630, a first feedback arm 635, and a second feedback arm 640. A laser source 601 is positioned at a first terminus of the emitter beam transformation arm 630. The laser source 601 includes a plurality of emitters located at fixed positions with respect to one another. The position of each one of the plurality of emitters defines a point in an emitter spatial position distribution. The laser source 601 emits a plurality of single wavelength, i.e. narrow spectral bandwidth, input beams that together constitute an external resonator input 602.

Upon exiting the laser source, the external resonator input 602 has a position spectrum that corresponds to the emitter spatial position distribution. This enables each constituent beam of the external resonator input 602 to be mapped to a particular emitter of the laser source 601 by its spatial position. The external resonator input 602 propagates from the laser source towards a reflection diffraction element 604 through a position-to-angle transformation element 603. The position-to-angle transformation element 603 maps a position of each single wavelength input beam to an angle of incidence with respect to the reflection diffraction element 604. The position-to-angle transformation element 603 thereby transforms the position spectrum of the external resonator input 602 into an angular spectrum. Thus, upon emerging from the position-to-angle transformation element 603, the external resonator input 602 possesses an angular spectrum. Specifically, after emerging from the position-to-angle transformation element 603, each constituent beam of the external resonator input 602 and its corresponding emitter may be identified by an angle of incidence with respect to the diffraction element 604. In the embodiment depicted in FIG. 6, the position-to-angle transformation element 603 is a Fourier lens. However, in alternative embodiments a variety of alternative transformation optics, including Fresnel lenses, mirror arrangements, and diffractive gratings may be utilized as the position-to-angle transformation element 603.

After propagating through the position-to-angle transformation element 603, the external resonator input 602 is split into separate components upon striking the first reflection diffraction element 604. In the embodiment depicted in FIG. 6, the reflection diffraction element 604 is a high-efficiency diffraction grating that acts as both an output beam combining element and a resonant feedback arm coupling element. Therefore, the majority of the power of an incident beam emerges from the interaction with the first reflection diffraction element as a diffraction, while a substantially smaller component emerges as a reflection. In the embodiment depicted in FIG. 6, it is preferably that substantially all of the power of an incident beam emerges from the interaction with the diffraction grating as either a zero order diffraction or a first order diffraction. Furthermore, it is preferable that the optical power carried by the first order diffraction is at least four times the optical power carried by the zero order diffraction. In other words, in the embodiment depicted in FIG. 6, it is desirable to select a diffraction grating that exhibits a first order diffraction efficiency of greater than 80% and simultaneously exhibits a zero order diffraction efficiency of less than 20%.

In the embodiment depicted in FIG. 6, the reflection diffraction element 604 also includes a backside thermal management element 620. The backside thermal management element 620 removes heat generated by absorption of electromagnetic radiation by the reflection diffraction element 604. The backside thermal management element 620 facilitates substantially one dimensional heat-flow (in a direction perpendicular to the plane in which the surface of the reflection diffraction element 604 lies) and thereby reduces beam distortion attributable to the heating of the material from which the reflection diffraction element 604 is constructed. One dimensional heat-flow further suppresses thermal lensing effects and eliminates local differences in the grating constant that result from thermal gradients induced by heating of the reflection diffraction element 604. One dimensional heat-flow can be achieved through selecting a diffractive element with an appropriate thickness-to-diameter ratio and the backside cooling element 620. The backside cooling element 620 is placed in "form-fitting" contact with the reflection diffraction element 604 provides an additional benefit in the form of providing mechanical stability for the reflection diffraction element 604 thereby preventing the element 604 from bending under thermal load. In the embodiment depicted in FIG. 6, the reflection diffraction element 604 is formed on a substrate with a high heat conductivity and a low coefficient of thermal expansion. For example the reflection diffraction element 604 may be formed from a substrate made of diamond, sapphire, or a glass-ceramic such as Zerodur. The backside thermal management element 620 may be made out of a material with high thermal conductivity, e.g. copper. The backside thermal management element 620 further has cooling channels 621. The cooling channels 621 may be filled with a liquid with a high specific heat, such as water. The cooling channels 621 transport heat generated at the reflection diffraction element 604 and transmitted into the backside thermal management element 620 away from the reflection diffraction element 604. One of skill in the art will appreciate that the cooling system depicted in FIG. 6 and described herein can be used with a variety of reflective optical elements depicted in the preceding figures. For example, a backside cooling element (such as the backside cooling element 620) could be used with the first and second reflective diffraction elements of FIGS. 1, 3, and 4 as well as with the reflective diffraction elements of FIGS. 2 and 5.

A first component of the external resonator arm input 602 emerging from the reflection diffraction element 604 is a diffraction of the resonator arm input 605 that constitutes a system output 605. The system output 605 is composed of a plurality of spatially and directionally overlapped single wavelength beams emitted from the plurality of emitters of the laser source 601. The spatial locations of the laser source 601, the position-to-angle transformation element 603, and the reflection diffraction element 604 are fixed at precise positions with respect to one another such that the components of the plurality of single wavelength beams emitted from the laser source 601 that are emitted as system output 605 emerge from an overlap region of the reflection diffraction element 604 with a common direction of propagation.

A second component of the external resonator arm input 602 emerging from the reflection diffraction element 604 is a reflection that constitutes a first feedback arm input 606. The first feedback arm input 606 consists of a plurality of single wavelength constituent beams. The first feedback arm input 606 possesses an angular spectrum that is a reflection of the angular spectrum imparted upon the external resonator arm input 602 by the position-to-angle transformation element 603. After emerging from the reflection diffraction element 604, the first feedback arm input 606 travels through a first feedback arm lens 607. The first feedback arm lens 607 directs the constituent beams of the first feedback arm input 606 at a first feedback arm high reflective mirror 608. Upon striking the first feedback arm high-reflective mirror 608, the constituent beams of the first feedback arm input 606 are reflected as first feedback arm output 609. The first feedback arm output travels back through the first feedback arm lens 607 and strikes the reflective diffraction element 604, which splits the first feedback arm output 609 into separate components.

A first component of the first feedback arm output 609 emerging from the reflection diffraction element is a reflection that constitutes unfiltered laser source resonant feedback 618. A second component of the second feedback arm output 609 emerging from the reflection diffraction element is a reflective diffraction that constitutes second feedback arm input 610. The second feedback arm input 610 includes a preferred resonant mode component 610A and an alternative resonant mode component 610B. The preferred resonant mode component 610A is composed of a plurality of spatially and directionally overlapped single wavelength constituent beams that emerge from the reflection diffraction element 604 with a common direction of propagation. Each constituent beam of the preferred resonant mode component 610A is composed of electromagnetic radiation corresponding to a preferred resonant mode of an emitter of the laser source 601. The alternative resonant mode component 610B is composed of a plurality of single wavelength constituent beams that emerge from the reflection diffraction element 604 at an angle with respect to the common direction of propagation of the preferred mode component 610A. Thus, the constituent beams of the alternative resonant mode component 610B are not spatially and directionally overlapped with respect to each other or with respect to the constituent beams of the preferred mode component 610A. Each constituent beam of the alternative resonant mode component 610B is composed of electromagnetic radiation corresponding to an alternative, non-preferred mode of an emitter of the laser source 601.

After emerging from the reflection diffraction grating 604, the second feedback arm input 610 travels through a first lens 611 of a second feedback arm telescope. The first lens 611 of the second feedback arm telescope directs the preferred mode component 610A through a spatial filtering element 612 but directs the alternative resonant mode component 610B at the spatial filtering element 612 such that its removed from the optical path defining the resonator. In this manner, the alternative resonant mode component 610B is filtered out of the external resonator and prevented from being returned to the laser 601 source and thereby from exciting alternative resonant modes of the emitters. The electromagnetic radiation composing the alternative resonant mode component 610B may be absorbed by the material composing the spatial filtering element 612, or may be reflected from or transmitted through the spatial filtering element 612 in a manner such that it is diverted from the optical path defining the external resonator.

After passing through the spatial filtering element, the preferred mode component 610A propagates through a second lens 613 of the second feedback arm telescope and towards a second feedback arm highly reflective mirror 614. The preferred mode component 610A is reflected from the second feedback arm highly reflective mirror 614 as second feedback arm output 615. Second feedback arm output 615 is a combined beam composed of a plurality of single wavelength constituent beams, wherein each constituent beam is composed of electromagnetic radiation corresponding to a preferred resonant mode of an emitter of the laser source 601. After reflecting from the second feedback arm highly reflective mirror 614, the constituent beams of the second feedback arm output 615 travel in a reverse direction through the second lens 613 of the second feedback arm telescope, through the spatial filtering element 612, and through the first lens 611 of the second feedback arm telescope until they strike the first reflection diffraction element 604. Upon striking the first reflection diffraction element 604, the second feedback arm output 615 is split into separate components. A first component is a reflection that serves as additional system output 605. A second component is a diffraction that serves as filtered first feedback arm input 616.

The filtered first feedback arm input 616 traverses the first feedback arm and is reflected from the first feedback arm highly reflective mirror 608 as filtered first feedback arm output 617. The filtered first feedback arm output 617 strikes the reflection diffraction element 604 and is separated into components. A first component of the filtered first feedback arm output 617 emerging from the reflection diffraction element 604 is a reflective diffraction that constitutes additional second feedback arm input 610. Therefore, a component of the beams continues traveling back and forth through the first feedback arm 635 and the second feedback arm 640. Thus, an interferometer is formed by the first feedback arm highly reflective mirror 608, the second feedback arm highly reflective mirror 614, and the first reflection diffraction element 604. A second component of the filtered first feedback arm output 617 emerging from the reflection diffraction element is a reflection that constitutes filtered laser source resonant feedback 618. The laser source resonant feedback 618 propagates through the position-to-angle transformation element 603 towards the laser source 601 in a direction of propagation that is opposite that of the external resonator input 602. The position-to-angle transformation element 603 transforms the angular spectrum of the filtered laser source resonant feedback 618 into a position spectrum that corresponds to the position of each emitter in the laser source 601. In that manner, each constituent beam of the laser source resonant feedback 618 is directed into a single emitter of the laser source 601 thereby stimulating emission of electromagnetic radiation corresponding to the preferred resonant mode of each emitter of the laser source 601. In the embodiment depicted in FIG. 6, the feedback efficiency is the ratio of the optical power coupled into waveguides of laser source 601 to the total optical power carried by the laser source resonant feedback 618. In order to promote wavelength stabilization of the emitters of the laser source 601, the feedback efficiency should be thirty percent or greater, and preferably greater than seventy percent.

It is thus contemplated that other implementations of the invention may differ in detail from foregoing examples. As such, all references to the invention are intended to reference the particular example of the invention being discussed at that point in the description and are not intended to imply any limitation as to the scope of the invention more generally. All language of distinction and disparagement with respect to certain features is intended to indicate a lack of preference for those features, but not to exclude such from the scope of the invention entirely unless otherwise indicated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A system for stabilizing the wavelength of beams emitted by a plurality of beam emitters, the system comprising:
   the plurality of beam emitters, each beam emitter emitting a beam;
   a first reflection diffraction element; and
   a feedback branch comprising a spatial filtering system;
   wherein the first reflection diffraction element directs a portion of the beams originating at the array into the feedback branch as feedback branch input,
   wherein the feedback branch directs a portion of the feedback branch input back into the plurality of beam emitters, and
   wherein the spatial filtering system is configured to perform spatial mode blocking.

2. The beam stabilization system of claim 1, wherein the first reflection diffraction element receives the beams originating from the plurality of beam emitters and directs, into the feedback branch as a feedback branch input, a reflection of the beams originating from the plurality of beam emitters.

3. The system of claim 2, wherein the first reflection diffraction element receives the beams originating from the plurality of beam emitters and directs, as a system output, a diffraction of the beams originating from the plurality of beam emitters.

4. The system of claim 1, wherein the plurality of beam emitters is an array of diode beam emitters.

5. The system of claim 4, wherein each beam emitter in the array of diode beam emitters emits a beam with an asymmetric profile, wherein each beam has a fast axis and a slow axis.

6. The system of claim 1, wherein each emitter in the plurality of beam emitters comprises a waveguide, and
   wherein at least thirty percent of the optical power of the portion of the feedback branch input directed back into the plurality of beam emitters is coupled into the plurality of waveguides.

7. The system of claim 1, wherein the spatial filtering system comprises one of the group consisting of: an aperture, a diaphragm, a waveguide structure, and a set of mirrors that include a gradient layer.

8. A system for stabilizing the wavelength of beams emitted by a plurality of beam emitters, the system comprising:
   the plurality of beam emitters, each beam emitter configured to emit a beam;
   a first reflection diffraction element configured to receive the beams emitted by the plurality of beam emitters via front facets of the beam emitters; and
   a feedback branch comprising a spatial filtering system;
   wherein the first reflection diffraction element directs a portion of the beams originating at the array into the feedback branch as feedback branch input, and
   wherein the feedback branch directs a portion of the feedback branch input back into the plurality of beam emitters.

9. The beam stabilization system of claim 8, wherein the first reflection diffraction element receives the beams originating from the plurality of beam emitters and directs, into the feedback branch as a feedback branch input, a reflection of the beams originating from the plurality of beam emitters.

10. The system of claim 9, wherein the first reflection diffraction element receives the beams originating from the plurality of beam emitters and directs, as a system output, a diffraction of the beams originating from the plurality of beam emitters.

11. The system of claim 8, wherein the plurality of beam emitters is an array of diode beam emitters.

12. The system of claim 11, wherein each beam emitter in the array of diode beam emitters emits a beam with an asymmetric profile, wherein each beam has a fast axis and a slow axis.

13. The system of claim 8, wherein each emitter in the plurality of beam emitters comprises a waveguide, and
   wherein at least thirty percent of the optical power of the portion of the feedback branch input directed back into the plurality of beam emitters is coupled into the plurality of waveguides.

14. The system of claim 8, wherein the spatial filtering system comprises one of the group consisting of: an aperture, a diaphragm, a waveguide structure, and a set of mirrors that include a gradient layer.

15. A system for stabilizing the wavelength of beams emitted by a plurality of beam emitters, the system comprising:
   the plurality of beam emitters, each beam emitter emitting a beam;
   a first reflection diffraction element;
   a second reflection diffraction element; and
   a feedback branch comprising a spatial filtering system;
   wherein the feedback branch directs a portion of the feedback branch input back into the plurality of beam emitters,
   wherein the first reflection diffraction element receives the beams originating from the plurality of beam emitters and directs, into the feedback branch as a feedback branch input, a diffraction of the beams originating from the array, and
   wherein the second reflection diffraction element receives a reflection of the beams originating from the plurality of beam emitters from the first reflection diffraction element without the reflection passing through any of the plurality of beam emitters.

16. The beam stabilization system of claim 15, wherein the first reflection diffraction element receives a reflection of the feedback branch input as a first feedback branch output and directs, into a second feedback branch a reflection of the first feedback branch output.

17. The system of claim 16, wherein the second reflection diffraction element receives the beams originating from the plurality of beam emitters and directs, as a system output, a diffraction of the beams originating from the plurality of beam emitters.

18. The system of claim 15, wherein the plurality of beam emitters is an array of diode beam emitters.

19. The system of claim 18 wherein each beam emitter in the array of diode beam emitters emits a beam with an asymmetric profile, wherein each beam has a fast axis and a slow axis.

20. The system of claim 1, wherein each emitter in the plurality of beam emitters comprises a waveguide, and
   wherein at least thirty percent of the optical power of the portion of the feedback branch input directed back into the plurality of beam emitters is coupled into the plurality of waveguides.

* * * * *